(12) United States Patent
Kim et al.

(10) Patent No.: US 8,937,012 B2
(45) Date of Patent: Jan. 20, 2015

(54) PRODUCTION METHOD FOR SEMICONDUCTOR DEVICE

(75) Inventors: Hai Won Kim, Gyeonggi-do (KR); Sang Ho Woo, Gyeonggi-do (KR); Sung Kil Cho, Gyeonggi-do (KR); Gil Sun Jang, Gyeonggi-do (KR)

(73) Assignee: Eugene Technology Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/814,533

(22) PCT Filed: Aug. 30, 2011

(86) PCT No.: PCT/KR2011/006389
§ 371 (c)(1),
(2), (4) Date: Feb. 6, 2013

(87) PCT Pub. No.: WO2012/033299
PCT Pub. Date: Mar. 15, 2012

(65) Prior Publication Data
US 2013/0130497 A1  May 23, 2013

(30) Foreign Application Priority Data
Sep. 6, 2010 (KR) .................. 10-2010-0086963

(51) Int. Cl.
*H01L 21/44* (2006.01)
*H01L 21/02* (2006.01)
(Continued)

(52) U.S. Cl.
CPC .. *H01L 21/02697* (2013.01); *H01L 21/823835* (2013.01); *H01L 21/32051* (2013.01); *H01L 29/4975* (2013.01); *C01B 33/06* (2013.01); *H01L 27/11521* (2013.01); *H01L 27/11568* (2013.01); *H01L 29/66825* (2013.01);
(Continued)

(58) Field of Classification Search
CPC ............... H01L 29/665; H01L 29/4975; H01L 21/28518; H01L 21/32053; H01L 21/823835; H01L 21/32051
USPC ........... 257/E21.438, E21.296, E21.591, 384; 438/664, 655
See application file for complete search history.

(56) References Cited

U.S. PATENT DOCUMENTS 6,797,575 B2 *  9/2004  Kim et al. ...................... 438/303
7,666,774 B2 *  2/2010  Zhu et al. ...................... 438/592
(Continued)

FOREIGN PATENT DOCUMENTS

| KR | 10-0272653 B1 | 12/2000 |
| KR | 10-2004-0001455 A | 1/2004 |
| KR | 10-2009-0106880 A | 10/2009 |

*Primary Examiner* — Bac Au
(74) *Attorney, Agent, or Firm* — Rabin & Berdo, P.C.

(57) ABSTRACT

Provided is a production method for a semiconductor device comprising a metal silicide layer. According to one embodiment of the present invention, the production method for a semiconductor device comprises the steps of: forming an insulating layer on a substrate, on which a polysilicon pattern has been formed, in such a way that the polysilicon pattern is exposed; forming a silicon seed layer on the exposed polysilicon pattern that has been selectively exposed with respect to the insulating layer; forming a metal layer on the substrate on which the silicon seed layer has been formed; and forming a metal silicide layer by carrying out a heat treatment on the substrate on which the metal layer has been formed.

7 Claims, 6 Drawing Sheets

(51) Int. Cl.
- *H01L 21/8238* (2006.01)
- *H01L 21/3205* (2006.01)
- *H01L 29/49* (2006.01)
- *C01B 33/06* (2006.01)
- *H01L 27/115* (2006.01)
- *H01L 29/66* (2006.01)
- *C23C 16/02* (2006.01)
- *C23C 16/04* (2006.01)
- *C23C 16/24* (2006.01)
- *H01L 21/28* (2006.01)

(52) U.S. Cl.
CPC ...... *H01L29/66833* (2013.01); *C23C 16/0227* (2013.01); *C23C 16/04* (2013.01); *C23C 16/24* (2013.01); *H01L 21/28273* (2013.01); *H01L 21/28282* (2013.01)
USPC .... 438/655; 438/664; 257/384; 257/E21.296; 257/E21.438; 257/E21.591

(56) References Cited

U.S. PATENT DOCUMENTS

| | | | |
|---|---|---|---|
| 2002/0195645 A1* | 12/2002 | Takada et al. | 257/314 |
| 2006/0157863 A1* | 7/2006 | Marsh | 257/774 |
| 2007/0108404 A1* | 5/2007 | Stewart et al. | 252/79.1 |
| 2009/0026527 A1* | 1/2009 | Ryusenji et al. | 257/316 |

* cited by examiner

FIG. 12

PRODUCTION METHOD FOR SEMICONDUCTOR DEVICE

TECHNICAL FIELD

The present invention relates to a production method for a semiconductor device, and more particularly, to a production method for a semiconductor device that includes a metal silicide layer.

BACKGROUND ART

Recently, electronic instruments need high integration and performance more and more according to the development of a semiconductor industry and user needs, and thus a semiconductor device that is a core part of an electronic instrument also needs high integration and performance. However, it has a difficulty in realizing a fine structure for high integration of the semiconductor device.

For example, if a design rule is decreased to realize the fine structure, it has a difficulty in obtaining desired properties because the electrical resistance of a conductive pattern increases.

DISCLOSURE OF THE INVENTION

Technical Problem

An objective of the present invention is to solve the conventional problems described above by providing a production method for a semiconductor device that includes a metal silicide layer.

Other objects of the present invention will be made clearer from the following detailed description and the accompanying drawings.

Technical Solution

According to an embodiment, a production method for a semiconductor device includes forming an insulating layer on a substrate, on which a polysilicon pattern has been formed, in such a way that the polysilicon pattern is exposed; forming a silicon seed layer selectively on the exposed polysilicon pattern with respect to the insulating layer; forming a metal layer on the substrate on which the silicon seed layer has been formed; and forming a metal silicide layer by carrying out a heat treatment on the substrate on which the metal layer has been formed.

Before the forming of the silicon seed layer, the method may further include pre-treating the substrate on which the insulating layer is formed, with solution containing hydrogen radical.

The pre-treating of the substrate may include bonding a hydrogen atom onto the insulating layer and the polysilicon pattern that are exposed to the substrate.

The solution containing hydrogen radical may be one or more solution selected from a group including HF, diluted hydrogen fluoride (DHF), buffered oxide etchant (BOE) solution.

The forming of the insulating layer may include forming a polysilicon pattern on the substrate; forming an insulating material on the substrate to cover the polysilicon pattern; and removing some of the insulating material to allow the polysilicon pattern to be exposed.

The forming of the silicon seed layer may include supplying one or more source gases selected from a group including $SiH_4$, $Si_2H_6$, $Si_3H_8$ and $Si_4H_{10}$ to the inside of a chamber into which the substrate is loaded.

The forming of the silicon seed layer may include maintaining the temperature of the substrate at 500° C. to 650° C.

The forming of the silicon seed layer may include maintaining the pressure in the chamber at 5 Torr to 20 Torr.

The metal layer may be one or more metals selected from a group including Ti, Co, and Ni.

After the forming of the metal silicide layer, the method may further include removing the metal layer remaining.

The insulating layer may be formed of oxide or nitride.

The forming of the silicon seed layer may include selectively replacing only the hydrogen atom bonded onto the polysilicon among hydrogen atoms bonded onto the insulating layer and the polysilicon pattern, with a silicon atom.

The forming of the silicon seed layer may include selectively forming the silicon seed layer on the exposed polysilicon pattern by using the difference between the bonding energy of hydrogen and oxygen or hydrogen and nitrogen and that of hydrogen and silicon.

Advantageous Effects

A production method for a semiconductor device according to an embodiment of the present invention may minimize the loss of voltages so that the semiconductor device has a stable property. In particular, if the semiconductor device is a non-volatile memory device that includes flash cells, it may allow stable program/erase properties of data by supplying voltages with the minimum power drop to the flash cells.

To this end, a metal silicide layer is formed to more cover the top of a polysilicon pattern to be able to minimize power drop that may occur at a conductive pattern made by the metal silicide layer and the polysilicon pattern.

MODE FOR CARRYING OUT THE INVENTION

Next, embodiments according to the technical spirit of the present invention will be described in detail with reference to the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the accompanying drawings, the same reference numerals mean the same elements consistently. Further, various elements and regions in the accompanying drawings are schematically depicted. Thus, the presenting invention is not limited by the relative size or interval depicted in the accompanying drawings.

Figure 1:
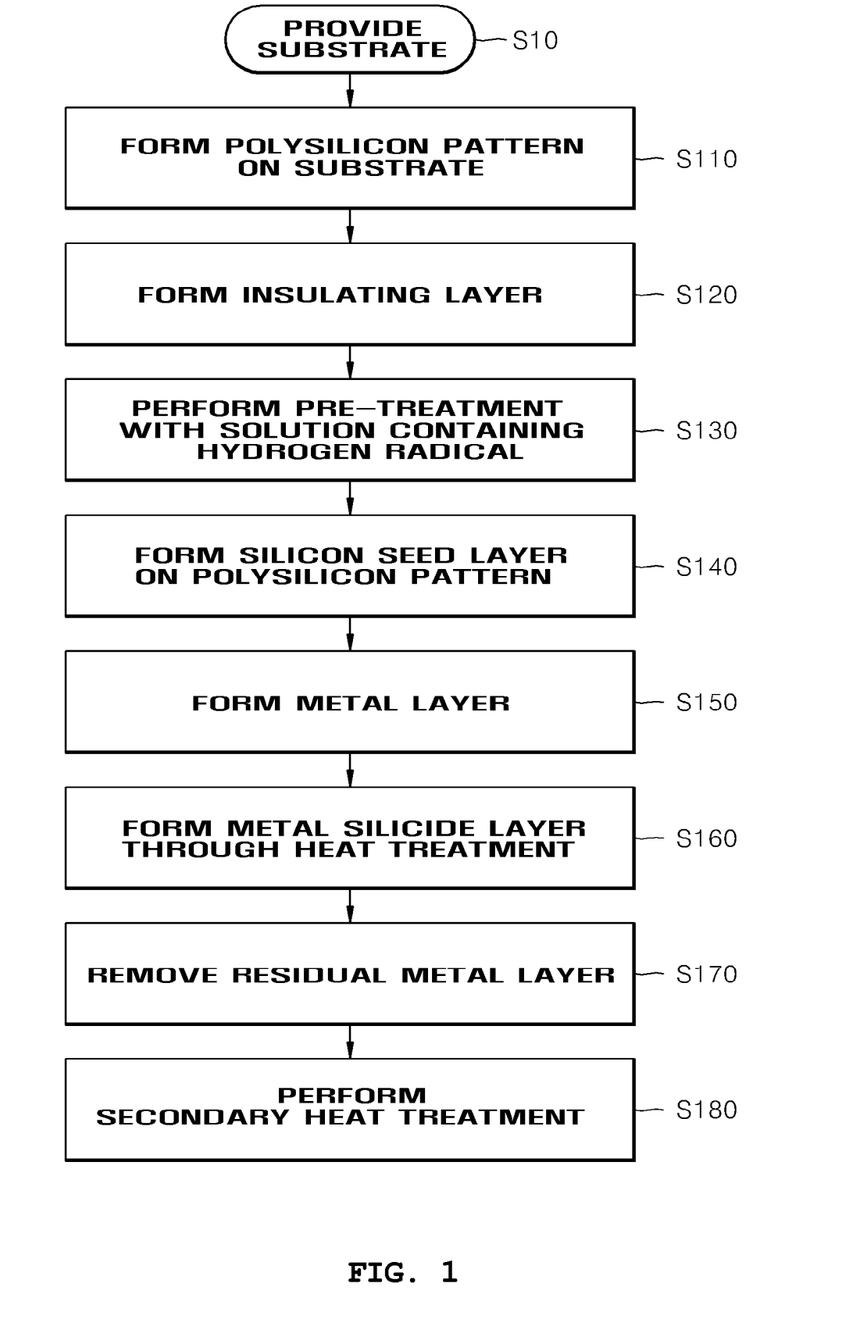
FIG. 1 is a flow chart representing a production method for a semiconductor device according to an embodiment of the present invention.

FIG. 1 is a flow chart representing a production method for a semiconductor device according to an embodiment of the present invention.

Referring to FIG. 1, a substrate is provided in step S10. The substrate may further include individual components for forming a semiconductor device. For example, the substrate may include a well region, an activated region defined by a device separator, etc.

A polysilicon pattern is formed on the substrate in step S110. Other layers may be formed underneath the polysilicon pattern to form patterns. That is, multi-layered structure patterns including polysilicon may be formed on the substrate. The multi-layered structure patterns may include a tunneling insulating layer pattern, a charge storing layer pattern, a blocking insulating layer pattern, and a polysilicon pattern, for example.

In order to form the multi-layered structure pattern, the tunneling insulating layer, the charge storing layer, the blocking insulating layer, and the polysilicon layer are sequentially stacked on the substrate and then, a photolithography process and an etching process may be performed.

An insulating layer is formed on the substrate so that the polysilicon pattern is exposed, in step S120. In order to expose the polysilicon pattern, an insulating material covering the polysilicon pattern is formed and then, some of the insulating material is removed so that the polysilicon pattern is exposed. In this case, the insulating material may remain so that other layers, namely, the substrate, the blocking insulating layer pattern, etc. other than the polysilicon pattern are not exposed.

Subsequently, the substrate on which the insulating layer exposing the polysilicon pattern is formed is pre-treated with solution containing hydrogen radical in step S130. The solution containing hydrogen racial may be HF solution, diluted hydrogen fluoride solution (DHF) or buffered oxide etchant (BOE) solution. If pre-treating is carried out with the solution containing the hydrogen radical, hydrogen atoms may be bonded onto the polysilicon pattern and the insulating layer.

Subsequently, a silicon seed layer is formed on the polysilicon pattern in step S140. In order to form the silicon seed layer, only hydrogen atoms bonded onto the polysilicon pattern may be selectively replaced with silicon atoms.

A metal layer is formed on the substrate on which the silicon seed layer is formed, in step S150. The metal layer may be formed of refractory metals, for example.

By performing heat treatment on the substrate on which the metal layer is formed, the metal layer reacts with the silicon seed layer and the polysilicon pattern to form a metal silicide layer in step S160. Subsequently, the residual metal layer is removed after the change to the metal silicide layer in step S170. As a result, the metal silicide layer is formed on the polysilicon pattern.

Subsequently, through selective heat treatment, the metal silicide layer may become compact in step S180.

Figure 2:
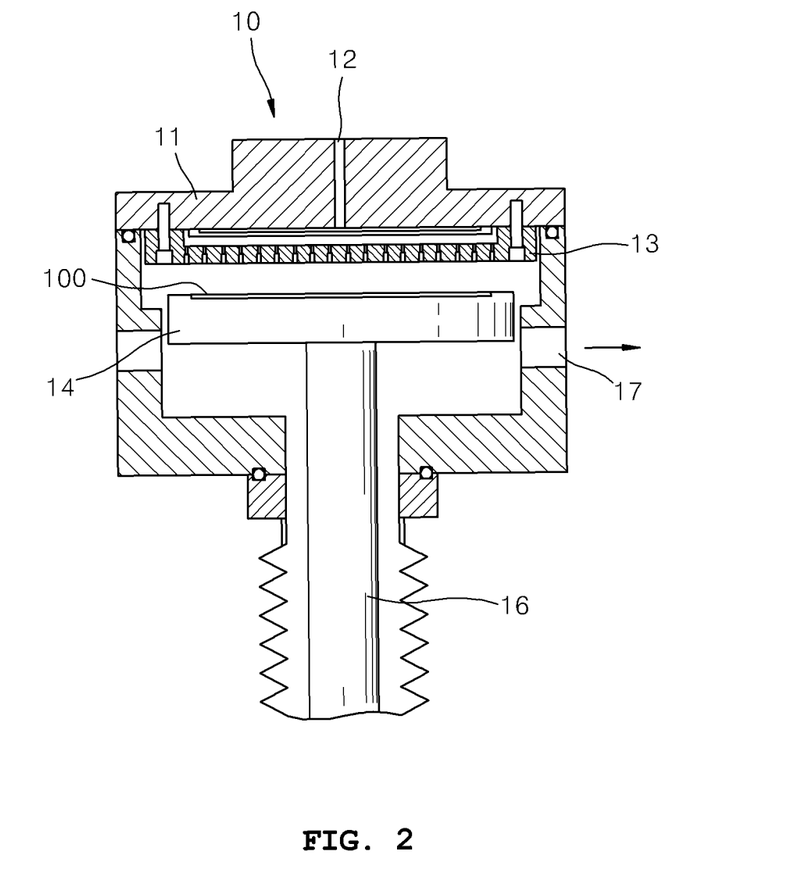
FIG. 2 is a schematic cross-sectional view representing a semiconductor production apparatus for producing a semiconductor device according to an embodiment of the present invention.

FIG. 2 is a schematic cross-sectional view representing a semiconductor production apparatus for producing a semiconductor device according to an embodiment of the present invention.

Referring to FIG. 2, an inlet 12 through which reactive gas is introduced is formed in a chamber 11 of a semiconductor production apparatus 10. The reactive gas introduced through the inlet 12 may be jet into the chamber 11 through a shower head 13.

A substrate 100 which is a target of deposition is placed on a chuck 14, which is supported by a chuck support 16. If necessary, the chuck 14 may allow the substrate 100 to maintain a given temperature by applying heat to the substrate 100. After deposition is carried by such an apparatus, a discharging operation may be carried through an outlet 17.

The semiconductor production apparatus 10 may be used for forming the seed layer in step S140 and forming the metal layer in step S150 previously described in FIG. 1. Alternatively, the semiconductor production apparatus 10 may be used for forming the seed layer in step S140 previously described in FIG. 1.

The semiconductor production apparatus 10 may be a chemical vapor deposition (CVD) apparatus, for example.

Figure 3:
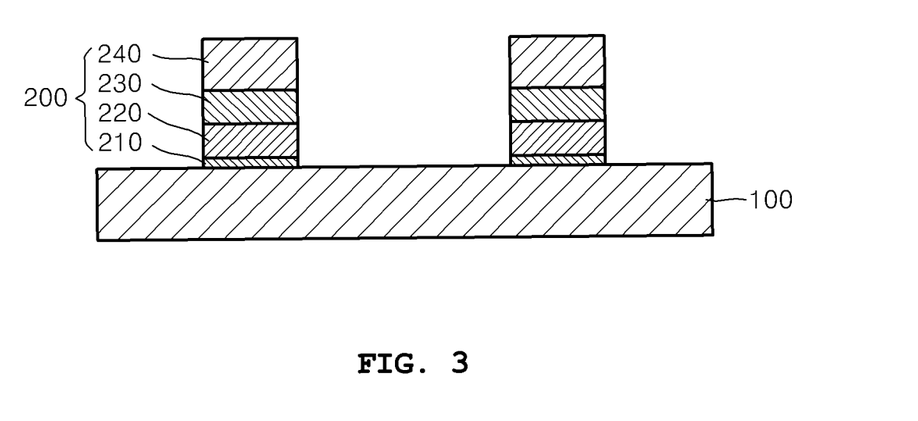
FIG. 3 is a cross-sectional view representing the step of forming a polysilicon pattern according to an embodiment of the present invention.

FIG. 3 is a cross-sectional view representing the step of forming a polysilicon pattern according to an embodiment of the present invention.

Referring to FIG. 3, a polysilicon pattern 240 is formed on the substrate 100. For example, the substrate 100 may include a semiconductor substrate such as a silicon or compound semiconductor wafer. Alternatively, the substrate 100 may include substrate materials different from semiconductor, such as glass, metal, ceramic, and quartz.

A polysilicon pattern 240 is formed on the substrate 100, and a tunneling insulating layer pattern 210, a charge storing layer pattern 220, and a blocking insulating layer pattern 230 are formed between the substrate 100 and the polysilicon pattern 240 to be able to form a multi-layered structure 200.

The tunneling insulating layer pattern 210 may be formed as a silicon dioxide film, an insulating film with high permittivity, a metal oxide film with high permittivity or their combinations, for example. The charges to be stored in the charge storing layer pattern 220 may be transferred through the tunneling insulating layer pattern 210 from the substrate 100. In this case, the charges to be stored in the charge storing layer pattern 220 may pass the tunneling insulating layer pattern 210 by thermal electrons or F-N tunneling.

The charge storing layer pattern 220 may be a conductor or a trap-type insulating layer. If the charge storing layer pattern 220 is the conductor, a semiconductor device to be subsequently formed may be a typical flash memory. If the charge storing layer pattern is the conductor, the charge storing layer pattern 220 may be formed of polysilicon. If the charge storing layer pattern 220 is the trap-type insulating layer, a semiconductor device to be subsequently formed may be charge trap flash (CTF). If the charge storing layer pattern is the trap-type insulating layer, the charge storing layer pattern 220 may include nitride.

The blocking insulating layer pattern 230 may block charges so that the charges stored in the charge storing layer pattern 220 are not leak to the polysilicon pattern 240. The blocking insulating layer pattern 230 may be determined in material and thickness considering capacitor coupling and insulating properties with the tunneling insulating layer pattern 210. The blocking insulating layer pattern 230 may be a membrane with high permittivity, a silicon dioxide film, a metal oxide film with high permittivity, or their combinations.

The polysilicon pattern 240 may play a role as a gate electrode if a semiconductor device to be subsequently formed is a non-volatile memory device.

In order to form the tunneling insulating layer pattern 210, the charge storing layer pattern 220, the blocking insulating layer pattern 230, and the polysilicon pattern 240, a tunneling charge layer (not illustrated), a charge storing layer (not illustrated), a blocking insulating layer (not illustrated), and a polysilicon layer (not illustrated) are formed and then photolithography and etching processes may be performed.

Figure 4:
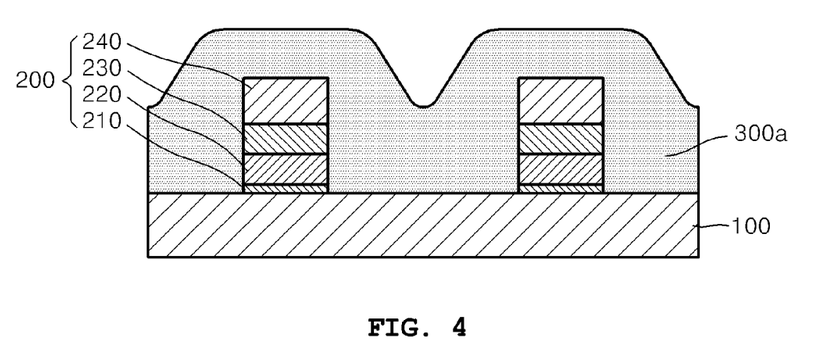
FIG. 4 is a cross-sectional view representing the step of forming an insulating material according to an embodiment of the present invention.

FIG. 4 is a cross-sectional view representing the step of forming an insulating material according to an embodiment of the present invention.

Referring to FIG. 4, an insulating material 300a is formed on the substrate 100 on which the polysilicon pattern 240 is formed, to wholly cover the polysilicon pattern 240. The insulating material 300a may be formed as a silicon dioxide film or a silicon nitride film, for example.

Figure 5:
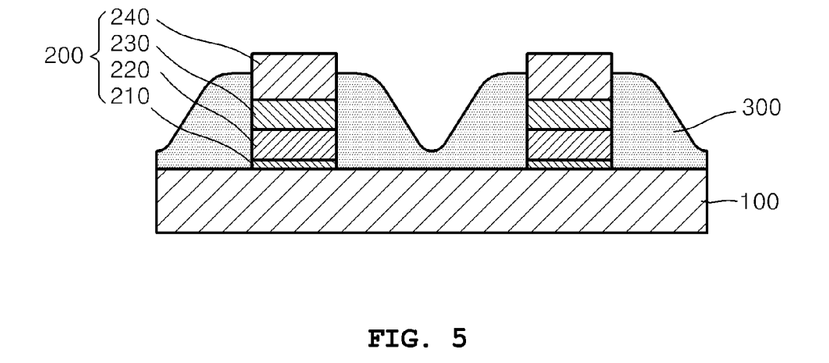
FIG. 5 is a cross-sectional view representing the step of forming an insulating layer according to an embodiment of the present invention.

FIG. 5 is a cross-sectional view representing the step of forming an insulating layer according to an embodiment of the present invention.

Referring to FIGS. 4 and 5, some of the insulating material 300a is removed to form an insulating layer 300. In order to form the insulating layer 300, an etch-back process may be performed after the forming of the insulating material 300a. Alternatively, in order to form the insulating layer 300, a planarization process such as chemical mechanical polishing (CMP) may be performed after the forming of the insulating material 300a.

If the etch-back process is performed to form the insulating layer 300, the insulating layer 300 may have different thickness depending on its position. The insulating layer 300 may be formed so that its parts adjacent to the multi-layered structure 200 are thicker than the intermediate part between the multi-layered structures 200. In addition, the top and part of the side of the polysilicon pattern 240 may be exposed through the insulating layer 300.

If the CMP is performed to form the insulating layer 300, the insulating layer 300 may have the same thickness with respect to the top of the substrate 100 although not illustrated. For example, the insulating layer 300 may have the same or similar thickness to the multi-layered structure 200. In addition, only the top of the polysilicon pattern 240 may be exposed through the insulating layer 300.

Figure 6:
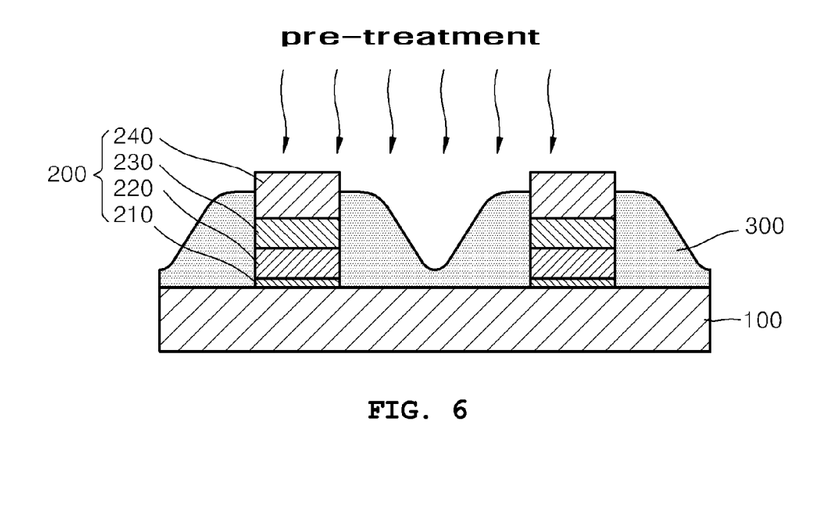
FIG. 6 is a cross-sectional view representing the step of pre-treating a substrate on which an insulating layer according to an embodiment of the present invention is formed.

FIG. 6 is a cross-sectional view representing the step of pre-treating a substrate on which an insulating layer according to an embodiment of the present invention is formed.

Referring to FIG. 6, the substrate 100 on which the insulating layer 300 is formed is pre-treated with solution containing hydrogen radical. The solution containing hydrogen racial may be HF, DHF or BOE solution.

Figure 7:
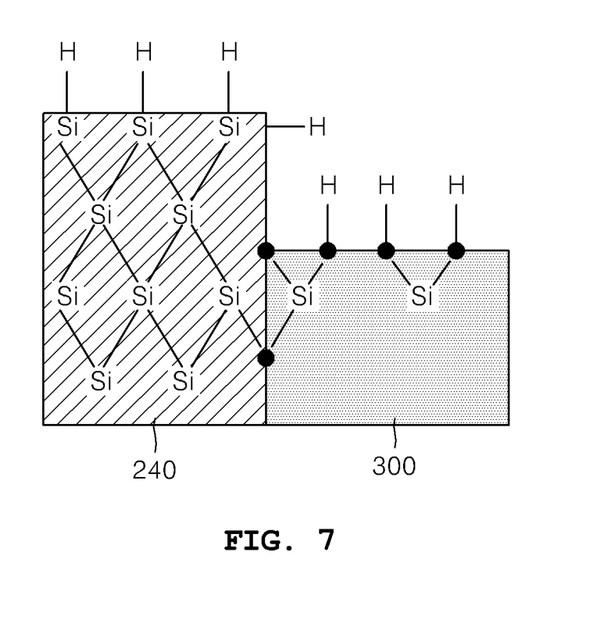
FIG. 7 is a conceptual view representing a cross-sectional view of pre-treating a substrate on which an insulating layer according to an embodiment of the present invention is formed.

FIG. 7 is a conceptual view representing a cross-sectional view of pre-treating a substrate on which an insulating layer according to an embodiment of the present invention is formed.

Referring to FIG. 7, if the substrate on which the insulating layer 300 is formed to expose the polysilicon pattern 240 is pre-treated with solution containing hydrogen radical, a hydrogen atom (H) is bonded onto the exposed surfaces of the polysilicon pattern 240 and the insulating layer 300.

That is, H is bonded so that those exposed to the surfaces among silicon atoms (Si) which the polysilicon pattern 240 contains satisfy a tetravalent bond. In addition, those exposed to the surfaces among oxygen atoms (O) or nitrogen atoms (N) which the insulating layer 300 contain are bonded to H. Bonding H onto the exposed surfaces as described above may be referred to as H radical passivation processing.

In order for H to be bonded to the exposed surfaces of the polysilicon pattern 240 and the insulating layer 300, some of the polysilicon 240 and the insulating layer 300 may be removed by solution that contains hydrogen radical. Alternatively, a natural oxide film formed on the polysilicon pattern 240 may be removed by solution that contains hydrogen radical.

Figure 8:
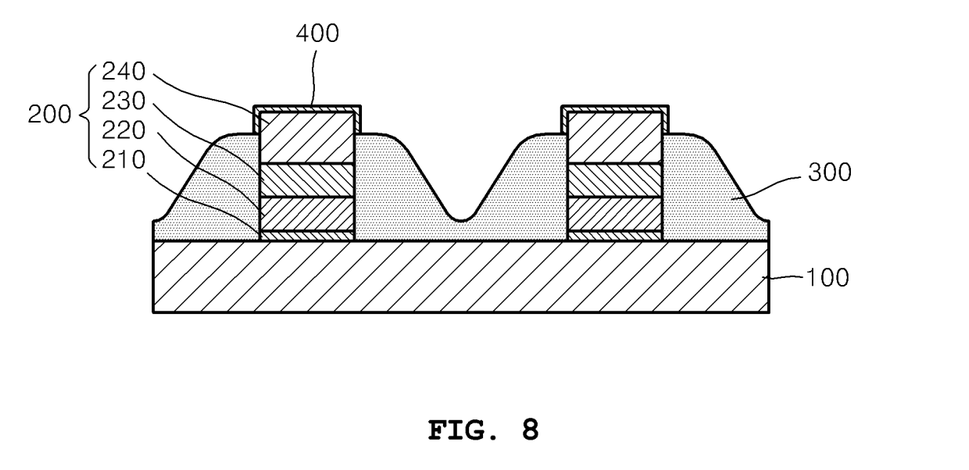
FIG. 8 is a cross-sectional view representing the step of forming a silicon seed layer according to an embodiment of the present invention.

FIG. 8 is a cross-sectional view representing the step of forming a silicon seed layer according to an embodiment of the present invention.

Referring to FIG. 8, a silicon seed layer 400 is selectively formed on the surface of the polysilicon pattern 240 exposed through the insulating layer 300. That is, while the silicon seed layer 400 is formed on the exposed surface of the polysilicon pattern 240, it is not formed on the exposed surface of the insulating layer 300.

However, although the silicon seed layer 400 may be formed on the surface of the insulating layer 300 adjacent to the polysilicon pattern 240, it may be represented because the seed layer 400 formed on the polysilicon pattern 240 covers part of the surface of the insulating layer 300 and it may not be formed from the surface of the insulating layer 300.

The pre-treatment as described in FIG. 6 using solution containing hydrogen radical on the substrate 100 on which the insulating layer 300 is formed may be performed within two hours before the silicon seed layer 400 so that bonded H may be maintained.

Figure 9:
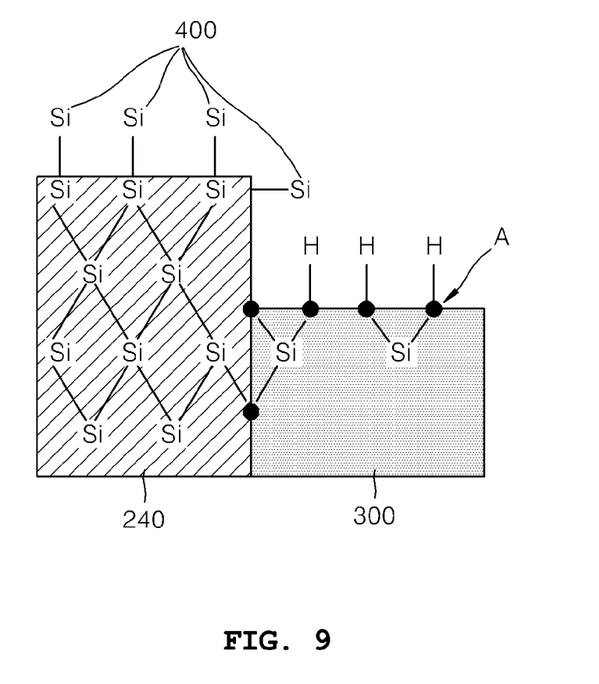
FIG. 9 is a conceptual view representing a cross-sectional view of forming a silicon seed layer according to an embodiment of the present invention.

FIG. 9 is a conceptual view representing a cross-sectional view of forming a silicon seed layer according to an embodiment of the present invention.

Referring to FIGS. 7 and 9, H bonded on the polysilicon pattern 240 is replaced with Si to form a silicon seed layer 400 on the polysilicon pattern 240. As illustrated, the silicon seed layer 400 may include both Si replacing H bonded onto the polysilicon pattern 240 and Si (not illustrated) bonded onto Si replacing H.

The silicon seed layer 400 may be formed only on the polysilicon pattern 240 and not on the insulating layer 300. That is, if the silicon seed layer 400 is formed, H bonded onto the polysilicon pattern 240 may be replaced with Si but H bonded onto the insulating layer 300 may be maintained as it is. Thus, the silicon seed layer 400 may be selectively formed on the polysilicon pattern 240 with respect to the insulating layer 300.

For example, the insulating layer 300 may be formed as a silicon dioxide film or a silicon nitride film. H may have different bonding energy according to the kind of atoms to be bonded. For example, the bonding energy of hydrogen and oxygen (H—O), hydrogen and nitrogen (H—N), and hydrogen and silicon (H—Si) is 4.8 eV, 4.0 eV, and 3.3 eV, respectively.

Thus, if a process condition for forming the silicon seed layer is regulated, bonded H may be selectively removed. That is, if a silicon precursor is supplied in an appropriate process condition to form the silicon seed layer 400, an H—Si bond with the lowest bonding energy may be separated and an H—N or H—O bond with relatively high bonding energy may be maintained.

Through this process, if the silicon precursor is supplied in the process condition that only the H—Si bond with the lowest bonding energy is separated, the silicon seed layer 400 may be selectively formed only on the polysilicon pattern 240.

In order to form the silicon seed layer 400, the temperature of the substrate 100 may be maintained at 500 C or 650 (C, for example. In addition, the pressure in the chamber may be maintained at 5 to 20 Torr to form the silicon seed layer 400.

In order to form the silicon seed layer 400, a silicon-based gas may be used as the silicon precursor. The silicon precursor may include, for example, a silicon-based gas, such as SiH4, Si2H6, Si3H8, or Si4H10. The silicon precursor may be supplied at a flow rate of 5 to 20 sccm for 20 to 160 seconds. A nitrogen (N2) or hydrogen (H2) gas may be simultaneously supplied as a carrier gas to supply the silicon precursor. The carrier gas may be supplied at a flow rate of 5000 to 30000 sccm.

If the pressure in the chamber increases while forming the silicon seed layer 400, the supply time of the silicon precursor may decrease. That is, the pressure in the chamber may be inversely proportional to the supply time of the silicon precursor.

Figure 10:
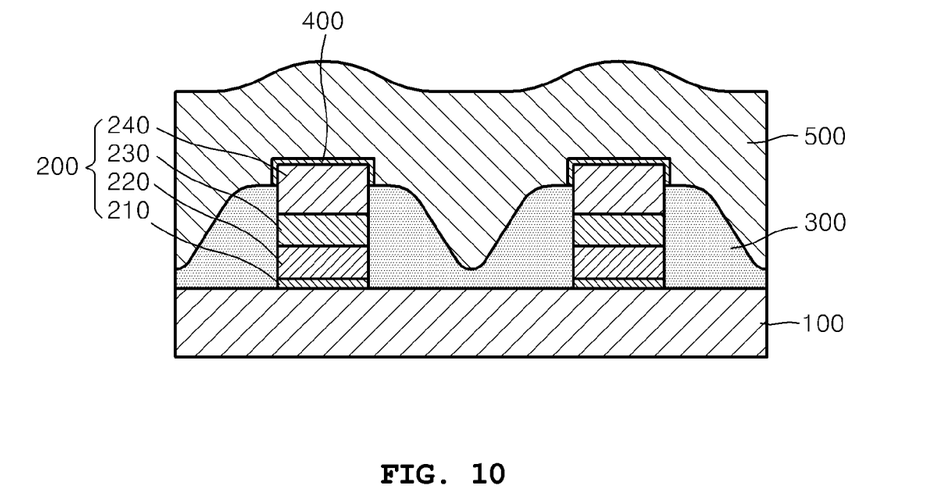
FIG. 10 is a cross sectional view representing the step of forming a metal layer according to an embodiment of the present invention.

FIG. 10 is a cross sectional view representing the step of forming a metal layer according to an embodiment of the present invention.

Referring to FIG. 10, a metal layer 500 may be formed to cover the substrate 100 on which the silicon seed layer 400 is formed. The metal layer 500 may be formed of refractory metals. The metal layer 500 may be Ti, Co, or Ni, for example.

Figure 11:
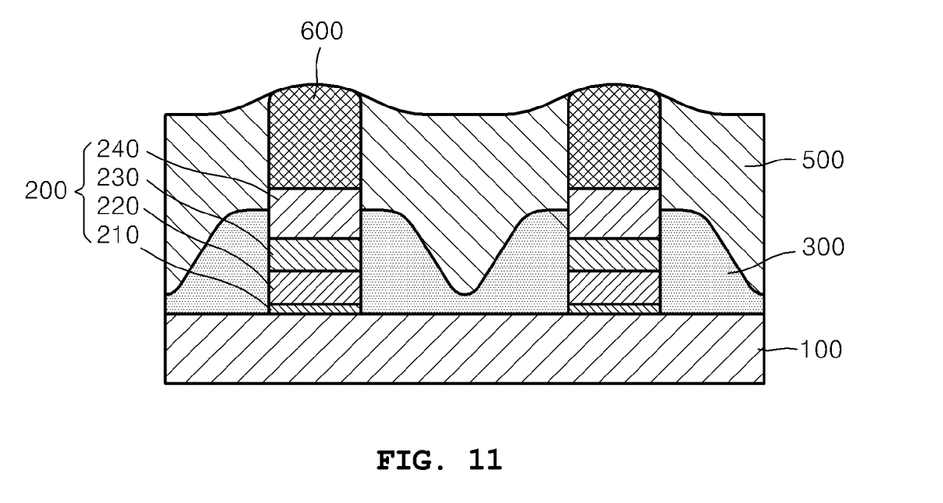
FIG. 11 is a cross-sectional view representing the step of forming a metal silicide layer according to an embodiment of the present invention.

FIG. 11 is a cross-sectional view representing the step of forming a metal silicide layer according to an embodiment of the present invention.

Referring to FIG. 11, a metal silicide layer 600 is formed on the polysilicon pattern 240 by performing heat treatment on the substrate 100 on which the metal layer 500 is formed. The metal silicide layer 600 may be formed by the bonding of a metal atom included in the metal layer 500 and the silicon atoms included in the polysilicon seed layer 400 and the polysilicon pattern 240 depicted in FIG. 10.

A heat treatment process such as a rapid thermal processing (RTP) may be performed to form the metal silicide layer 600. The metal silicide layer 600 may be formed of TiSi2, CoSi2 or NiSi, for example.

If the metal layer 500 is formed of Ti, the metal silicide layer 600 may be formed to have a C54-TiSi$_2$ phase whose resistivity is lower than that of C49-TiSi$_2$. Alternatively, the metal layer is formed of Co, the metal silicide layer 600 may be formed to have CoSi2 whose resistivity is lower than that of Co$_2$Si or CoSi. Alternatively, if the metal layer is formed of Ni, the metal silicide layer 600 may be formed to have NiSi whose resistivity is lower than that of NiSi$_2$.

If the silicon seed layer 400 illustrated in FIG. 10 is formed, the metal silicide layer 600 may be formed to more cover the top of the polysilicon pattern 400. If a flash cell such as the multi-layered structure 200 is included between the polysilicon pattern 400 and the substrate 100, a high voltage is needed. Thus, as the metal silicide layer 600 more covers the top of the polysilicon pattern 400, voltage drop may be minimized. Through this process, a semiconductor device to which many flash cells are connected through the same polysilicon pattern 400, such as a NAND flash device may allow stable program/erase properties of data.

Figure 12:
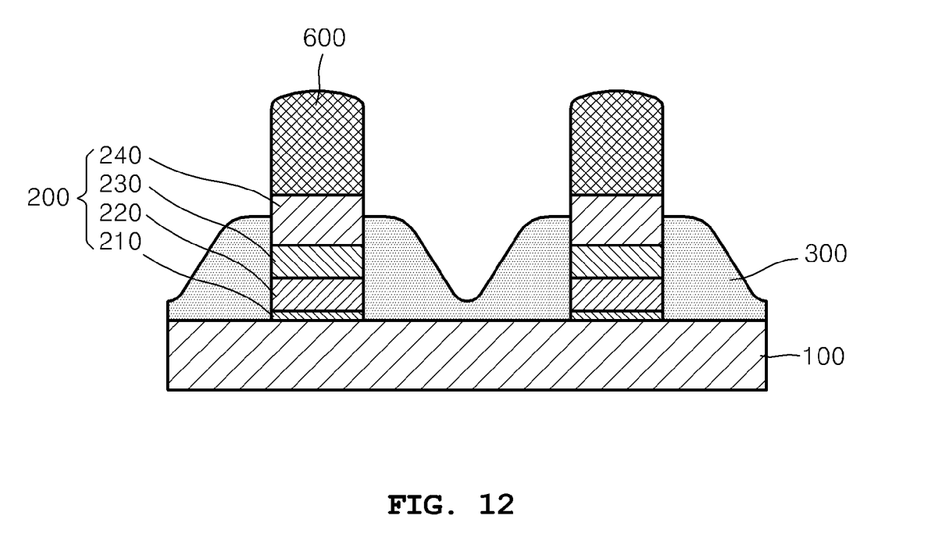
FIG. 12 is a cross-sectional view representing the step of removing a residual metal layer according to an embodiment of the present invention.

FIG. 12 is a cross-sectional view representing the step of removing a residual metal layer according to an embodiment of the present invention.

Referring to FIGS. 11 and 12, a residual metal layer 500 remaining after the forming of the metal silicide layer 600 is removed. In order to remove the residual metal layer 500, an etching process with an etching selection ratio may be used for the metal silicide layer 600 and the insulating layer 300.

Through this process, only the metal silicide layer 600 and the polysilicon pattern 400 may be exposed to the insulating layer 300 on the substrate 100.

Subsequently, secondary heat treatment may be selectively performed as needed. The secondary heat treatment may be used to more decrease the resistivity of the metal silicide layer 600. For example, if the metal silicide layer 600 is Ti-silicide, the secondary heat treatment may be performed to change non C54-TiSi$_2$ phases such as C49-TiSi$_2$ to C54-TiSi$_2$. In this case, the secondary heat treatment may be performed at a higher temperature than the heat treatment process described in FIG. 11.

Alternatively, if the metal silicide layer 600 is Co-silicide for example, the secondary heat treatment may be performed to change non CoSi$_2$ phases such as Co$_2$Si or CoSi to CoSi$_2$. In this case, the secondary heat treatment may be performed at a higher temperature than the heat treatment process described in FIG. 11.

However, if the metal silicide layer 600 is Ni-silicide for example, non NiSi phases such as Ni3Si, Ni31Si12, Ni5Si2, Ni2Si, Ni3Si2 remain, the secondary heat treatment may be performed to change them to the NiSi phase. However, in this case, the heat treatment may be performed at a relatively low temperature compared to Ti-silicide or Co-silicide cases previously described so that the NiSi2 phase is not formed.

Although the present invention has been described in detail through exemplary embodiments, other forms of embodiments are also possible. Therefore, the technical spirit and scope of the claims described below are not limited to exemplary embodiments.

INDUSTRIAL APPLICABILITY

The present invention is applicable to a process of producing various forms of semiconductor.

The invention claimed is:

1. A production method for a semiconductor device, the method comprising steps of:
 (a) forming a polysilicon pattern on a substrate;
 (b) forming an insulating material on the substrate to cover the polysilicon pattern, the insulating material being formed as a silicon dioxide film or a silicon nitride film;
 (c) removing the insulating material covering the polysilicon pattern to form an insulating layer, so that the polysilicon pattern is exposed;
 (d) pre-treating the substrate with a solution containing hydrogen radical to bond hydrogen atoms onto the insulating layer and the polysilicon pattern that are exposed to the substrate;
 (e) forming a silicon seed layer only over the polysilicon pattern by supplying one or more source gases selected from a group including SiH4, Si2H6, Si3H8 and Si4H10 to an inside of a chamber in which the substrate is loaded, and by regulating a process condition to replace the hydrogen atoms bonded onto the polysilicon pattern with silicon atoms;
 (f) forming a metal layer on the silicon seed layer and the insulating layer; and (g) forming a metal silicide layer by carrying out a heat treatment only on the polysilicon pattern, wherein the steps (a), (b), (c), (d), (e), (f) and (g) are performed in this order.

2. The method of claim 1, wherein the solution containing hydrogen radical is one or more solution selected from a group including HF, diluted hydrogen fluoride (DHF), and buffered oxide etchant (BOE) solution.

3. The method of claim 1, wherein the forming of the silicon seed layer comprises maintaining temperature of the substrate at 500° C. to 650° C.

4. The method of claim 1, wherein the forming of the silicon seed layer comprises maintaining pressure in the chamber at 5 Torr to 20 Torr.

5. The method of claim 1, wherein the metal layer is one or more metals selected from a group including Ti, Co, and Ni.

6. The method of claim 1, further comprising, after the forming of the metal silicide layer, removing the metal layer remaining.

7. The method of claim 1, wherein the regulating the process condition of step (e) comprises supplying an energy to the inside of the chamber, the energy is greater than a bonding energy of hydrogen and silicon and less than a bonding energy of hydrogen and oxygen or hydrogen and nitrogen.

* * * * *